(12) United States Patent  
Park (10) Patent No.: US 8,829,508 B2
(45) Date of Patent: Sep. 9, 2014

(54) ORGANIC LIGHT EMITTING DISPLAY COMPRISING A BATTERY AND A FLEXIBLE PRINTED CIRCUIT BOARD

(71) Applicant: Samsung Display Co., Ltd., Yongin (KR)

(72) Inventor: Jin-Hee Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 13 days.

(21) Appl. No.: 13/721,500

(22) Filed: Dec. 20, 2012

(65) Prior Publication Data

US 2014/0048778 A1   Feb. 20, 2014

(30) Foreign Application Priority Data

Aug. 16, 2012   (KR) .................. 10-2012-0089664

(51) Int. Cl.
*H01L 29/08*   (2006.01)

(52) U.S. Cl.
USPC .......... 257/40; 257/59; 257/72; 257/E23.065; 257/E23.177; 361/679; 361/748; 361/749; 361/760; 349/58; 349/56; 349/150; 349/152

(58) Field of Classification Search
None
See application file for complete search history.

(56) References Cited

U.S. PATENT DOCUMENTS

| 7,435,914 | B2 | 10/2008 | Cheng | |
|---|---|---|---|---|
| 2004/0174487 | A1* | 9/2004 | Yamazaki et al. | 349/150 |
| 2011/0108979 | A1 | 5/2011 | Nakagawa et al. | |
| 2013/0100392 | A1* | 4/2013 | Fukushima | 349/150 |
| 2014/0092564 | A1* | 4/2014 | Chuang et al. | 361/730 |

FOREIGN PATENT DOCUMENTS

| JP | 2008233779 A | * 10/2008 |
|---|---|---|
| JP | 2010-27706 | 2/2010 |
| KR | 10-2004-0061433 | 7/2004 |
| KR | 10-2007-0019358 | 2/2007 |
| WO | WO 2012/002272 A1 | * 5/2012 |

* cited by examiner

*Primary Examiner* — Marcos D. Pizarro
*Assistant Examiner* — Cesar Lopez
(74) *Attorney, Agent, or Firm* — Robert E. Bushnell, Esq.

(57) ABSTRACT

A display apparatus including an organic light emitting display including a terminal portion, a battery disposed on a surface of the organic light emitting display, and a flexible printed circuit board (PCB) bent to cover the organic light emitting display and the battery, a side of the flexible PCB being connected to the terminal portion and another side of the flexible PCB extending outside and attached to the battery.

19 Claims, 5 Drawing Sheets

ORGANIC LIGHT EMITTING DISPLAY COMPRISING A BATTERY AND A FLEXIBLE PRINTED CIRCUIT BOARD

CLAIM OF PRIORITY

This application makes reference to, incorporates the same herein, and claims all benefits accruing under 35 U.S.C. §119 from an application earlier filed in the Korean Intellectual Property Office on the 16 Aug. 2012 and there duly assigned Serial No. 10-2012-0089664.

BACKGROUND OF THE INVENTION

1. Field of the Invention

The present invention relates to a display apparatus.

2. Description of the Related Art

Examples of display devices include a liquid crystal display (LCD), a field emission display (FED), a plasma display panel (PDP), an organic light emitting display, and so forth.

Among the display devices, the organic light emitting display is a display device including a pixel electrode, an opposite electrode, and an organic light emitting layer provided between the pixel electrode and the opposite electrode. As a voltage is applied to the pixel electrode and the opposite electrode, holes injected from the pixel electrode and electrons injected from the opposite electrode are combined with each other and disappear in the organic light emitting layer, thereby forming excitons. The organic light emitting layer emits light by energy transferred from the formed excitons to the organic light emitting layer, and thus an image is formed.

A display device including such an organic light emitting device generally encapsulates a display unit including the organic light emitting device by using an encapsulation substrate.

SUMMARY OF THE INVENTION

The present invention provides a display apparatus in which a flexible printed circuit board covers a battery, thereby improving processing reliability and apparatus reliability.

According to an aspect of the present invention, there is provided a display apparatus including an organic light emitting display including a terminal portion, a battery disposed on a surface of the organic light emitting display, and a flexible printed circuit board (PCB) bent to cover the organic light emitting display and the battery, a side of the flexible PCB being connected to the terminal portion and another side of the flexible PCB extending outside and attached to the battery.

According to another feature of the present invention, the battery may be disposed to cover at least a display region of the organic light emitting display.

According to still another feature of the present invention, the battery may be disposed to cover the organic light emitting display.

According to further another feature of the present invention, the flexible PCB may be a chip on film (COF).

According to yet another feature of the present invention, the COF may include a terminal connection portion connected to the terminal portion, a bent portion bent between the terminal portion and the battery, and an extension portion extending toward the battery.

According to yet another feature of the present invention, the COF may include a driver-integrated circuit (DR-IC) for driving the display apparatus.

According to yet another feature of the present invention, the driver-integrated circuit (DR-IC) may be disposed on a side of the extension portion.

According to yet another feature of the present invention, the driver-integrated circuit (DR-IC) may be disposed toward outside the battery.

According to yet another feature of the present invention, a distance between the extension portion and the terminal connection portion may be greater than a sum of a thickness of the battery and a thickness of the organic light emitting display.

According to yet another feature of the present invention, the display apparatus may further include a circuit board electrically connected with the COF to supply a data signal to the terminal portion.

According to yet another feature of the present invention, the circuit board may be electrically connected with the extension portion of the COF.

According to yet another feature of the present invention, the circuit board may be disposed outside the battery.

According to yet another feature of the present invention, the display apparatus may further include a bracket for receiving the battery.

According to yet another feature of the present invention, the bracket may be disposed between the battery and the organic light emitting display.

According to yet another feature of the present invention, the display apparatus may further include a polarization film.

According to yet another feature of the present invention, the polarization film may be disposed on a side of the organic light emitting display on which an image is formed.

According to yet another feature of the present invention, the battery may be disposed on a surface of the organic light emitting display opposite the polarization film.

According to yet another feature of the present invention, the display apparatus may further include a light blocking portion on a surface of the battery adhered with the organic light emitting display.

According to yet another feature of the present invention, the organic light emitting display may include an organic light emitting device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

As the present invention can be diversely changed and have various embodiments, specific embodiments will be illustrated in the drawings and described in detail. While the present invention is not limited to a particular embodiment, all modification, equivalents and substitutes included in the spirit and scope of the present invention are understood to be included therein. In a description of the present invention, well-known techniques will not be described in detail if they unnecessarily obscure the subject matter of the present invention.

As used herein, terms such as "first," "second," etc. are used to describe various components, but the components should not be defined by these terms. The terms are used only for distinguishing one component from another component.

The terms used herein are for illustrative purposes of a particular embodiment only and should not be construed to limit the present invention. As used in this specification, a singular form may, unless definitely indicating a particular case in terms of the context, include a plural form. Also, the expressions "comprise" and/or "have" used in this specification neither define the mentioned characteristics, numbers, steps, operations, components, parts, and/or combinations of these, nor exclude the presence or addition of one or more other different characteristics, numbers, steps, operations, components, parts, and/or combinations of these.

Hereinafter, exemplary embodiments of the present invention will be described in more detail with reference to the accompanying drawings.

Figure 1A:
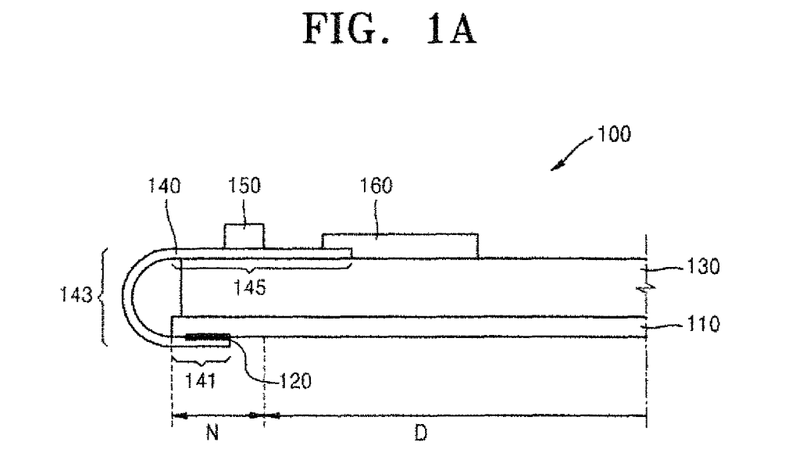
FIG. 1A is a cross-sectional view schematically showing a display apparatus according to an exemplary embodiment of the present invention.

FIG. 1A is a cross-sectional view schematically showing a display apparatus 100 according to an exemplary embodiment of the present invention.

Referring to FIG. 1A, the display apparatus 100 may include an organic light emitting display 110, a battery 130, a flexible printed circuit board (PCB) 140, a circuit board 160, and a driver-integrated circuit (DR-IC) 150.

The organic light emitting display 110 may include (refer to FIG. 5) a first substrate 109 and a plurality of layers (10, 20 and 111-116) forming a display unit between the first substrate 109 and a second substrate 119.

The first substrate 109 (FIG. 5) may be formed of a plastic material having superior heat resistance and durability, such as polyethylene ether phthalate, polyethylene naphthalate, polycarbonate, polyarylate, polyetherimide, polyethersulfone, polyimide, etc. However, the present invention is not limited to this example, and various materials having flexibility may be used for the first substrate 109.

On a surface of the first substrate 109 (FIG. 5) is provided a display unit to form an image. The display unit may include various display devices capable of forming an image. For example, the display unit may include an organic light emitting device, an inorganic light emitting device, a liquid crystal device, an electrophoretic device, or the like.

Referring again to FIG. 1A, on the organic light emitting display 110 may be formed a display region D and a non-display region N which is disposed outside the display region D.

The display region D is a region in which an image is displayed, and various display devices (not shown), such as an organic light emitting device, a liquid crystal display device, an electrophoretic device, etc., may be disposed thereon. On the non-display region N may be disposed various circuits (not shown) and interconnections (not shown) for supplying an image signal to a display device located on the display region D.

On a surface of the organic light emitting display 110 may be disposed the battery 130. The battery 130 may be disposed to cover at least the display region D of the organic light emitting display 110. The battery 130 may be disposed to cover the organic light emitting display 110.

A terminal portion 120 is provided on the non-display region N of the organic light emitting display 110. The terminal portion 120 electrically connects the organic light emitting display with the flexible PCB 140.

The circuit board 160 may be disposed outside the battery 130. The circuit board 160 supplies a data signal to the organic light emitting display 110.

The circuit board 160 and the organic light emitting display 110 are electrically connected by the flexible PCB 140. The flexible PCB 140 is bent to cover portions of organic light emitting display 110 and battery 130, one side of which is connected to the terminal portion 120 and the other side of which extends outside the battery 130. Therefore, the flexible PCB 140 may include a terminal connection portion 141 connected to the terminal portion 120, a bent portion 143 bent between the terminal portion 120 and the battery 130, and an extension portion 145 extending from an end of the bent portion 143 toward the battery 130.

The flexible PCB 140 may be a Chip On Film (COF).

The driver-integrated circuit (DR-IC) 150 for driving the display apparatus 100 may be connected to the flexible PCB 140. The driver-integrated circuit (DR-IC) 150 may be disposed on a side of the extension portion 145 of the flexible PCB 140 toward outside the battery 130.

Figure 1B:
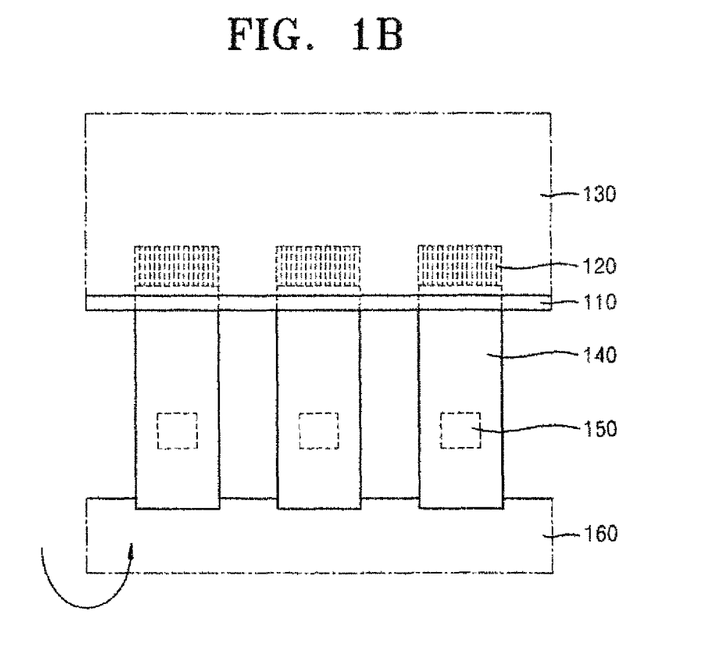
FIG. 1B is a view schematically showing a method for manufacturing the display apparatus shown in FIG. 1A.

FIG. 1B is a view schematically showing a method for manufacturing the display apparatus 100 shown in FIG. 1A.

Referring to FIG. 1B, the driver-integrated circuit (DR-IC) 150 is mounted on the flexible PCB 140, and the circuit board 160 is bonded to an end of the flexible PCB 140 on which the driver-integrated circuit (DR-IC) 150 is mounted, after which the circuit board 160 is placed on and adhered onto the battery 130 in a state where the flexible PCB 140 is bent.

Figure 2A:
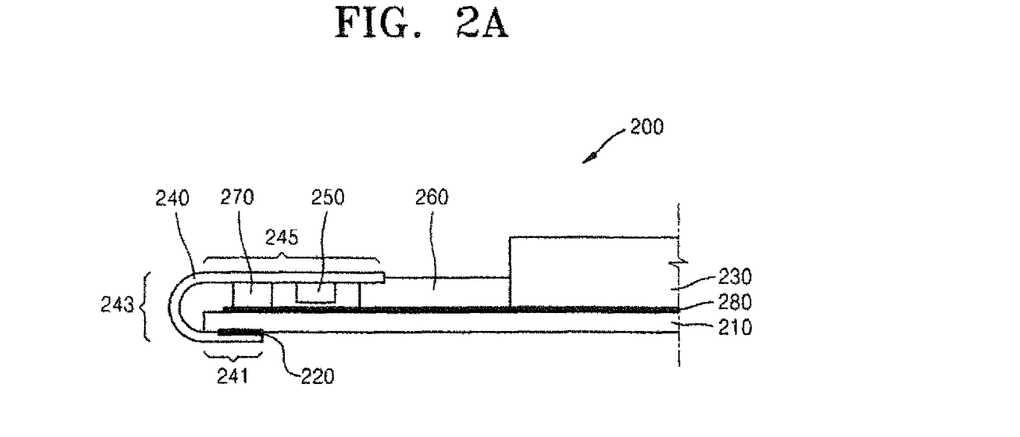
FIG. 2A is a cross-sectional view schematically showing a display apparatus according to A A Comparison Example with respect to the present invention.
Figure 2B:
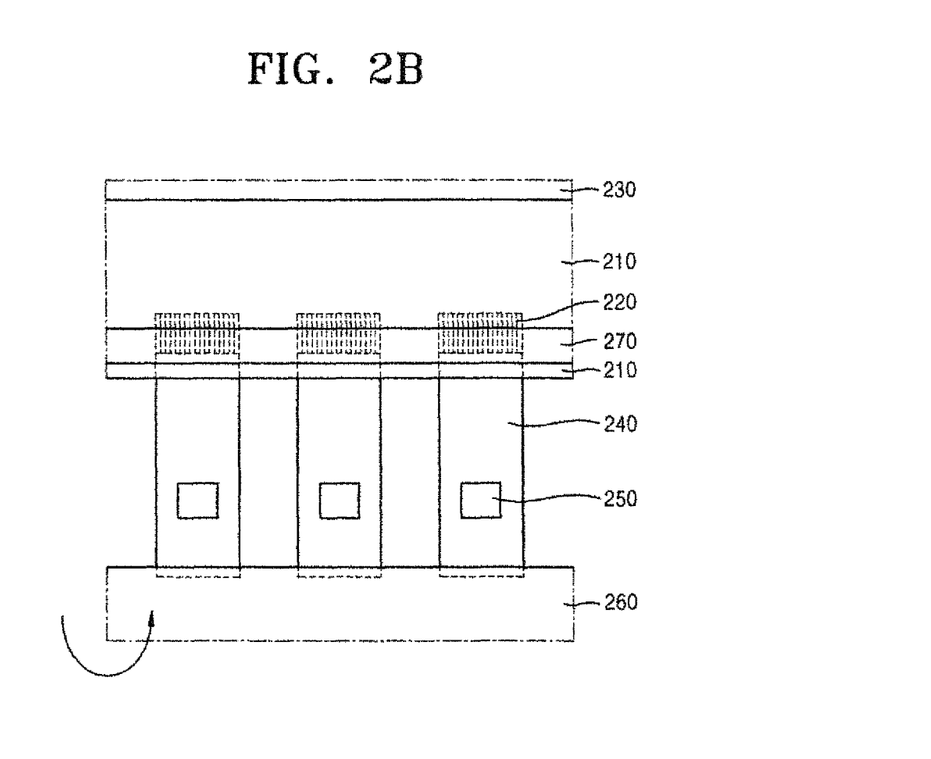
FIG. 2B is a view schematically showing a method for manufacturing the display apparatus according to the Comparison Example.

FIG. 2A is a cross-sectional view schematically showing a display apparatus 200 according to a Comparison Example with respect to the present invention, and FIG. 2B is a view schematically showing a method for manufacturing the display apparatus 200 according to the Comparison Example.

Referring to FIGS. 2A and 2B, in case of the display apparatus 200 according to the Comparison Example, during assembly of the display apparatus 200, the flexible PCB 240 is folded and adhered onto an organic light emitting display 210. However, since a thickness of the organic light emitting display 210 is small of about 0.15 mm, a radius of curvature of the bent portion 243 of the flexible PCB 240 is small. As a result, the following problems may occur:

first, the bent portion 243 of the flexible PCB 240 may be damaged (film lead crack);

second, since the driver-integrated circuit (DR-IC) 250 is disposed between the extension portion 245 of the flexible PCB 240 and the organic light emitting display 210, a crack may be generated in the chip due to a physical shock generated in adhesion of the flexible PCB 240 (IC crack); and third, even if the flexible PCB 240 is adhered, the adhered flexible PCB 240 may come off due to a tension of the flexible PCB 240.

Figure 3:
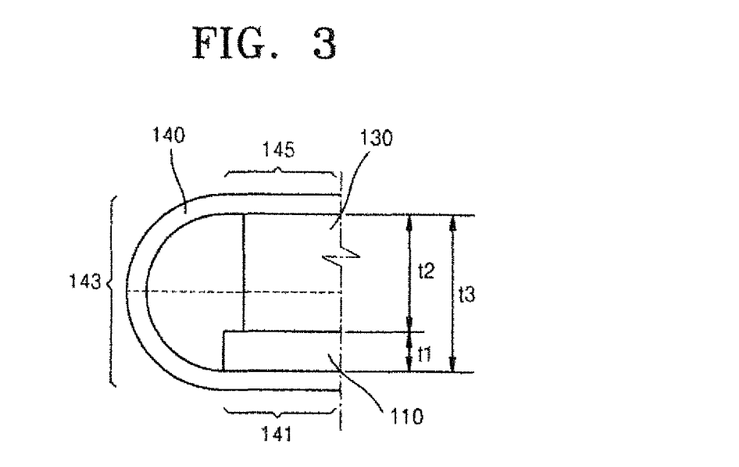
FIG. 3 is a cross-sectional view schematically showing enlargement of a bent portion of the display apparatus shown in FIG. 1A.

FIG. 3 is a cross-sectional view schematically showing enlargement of the bent portion 143 of the display apparatus 100 shown in FIG. 1A.

Referring to FIG. 3, a distance t3 between the extension portion 145 of the flexible PCB 140 and the terminal connection portion 141 is greater than a sum of a thickness t1 of the organic light emitting display 110 and a thickness t2 of the battery 130. Therefore, a radius of curvature of the bent portion 143 of the display apparatus 100 according to the current embodiment is larger than that of the bent portion 243 (see FIG. 2A) of the display apparatus 200 according to the Comparison Example. Consequently, with the increased radius of curvature of the bent portion 143 of the flexible PCB 140, the following effects may be obtained:

first, as the radius of curvature of the bent portion 143 of the flexible PCB 140 is increased, a damage of the bent portion 143 of the flexible PCB 140 (film lead crack) may be prevented;

second, as the driver-integrated circuit (DR-IC) 150 is disposed outside the flexible PCB 140, a crack in the chip due to a physical shock caused in adhesion of the flexible PCB 140 (IC crack) may be prevented; and third, after the flexible PCB 140 is adhered, it is possible to prevent the adhered flexible PCB 140 from coming off due to a tension of the flexible PCB 140.

Referring again to FIG. 2A, in the display apparatus 200 according to the Comparison Example, the flexible PCB 240 and the organic light emitting display 210 are adhered to each other by a both-side tape 270, such that an adhered surface of the flexible PCB 240 is limited by an area of the both-side tape 270. A terminal portion 220 is provided on terminal connection portion 241, with the terminal portion 220 electrically connecting the organic light emitting display 210 with the flexible PCB 240.

However, as shown in FIG. 1A, by adhering the flexible PCB 140 onto the battery 130, the adhered surface of the flexible PCB 140 may be expanded, such that adherence of the flexible PCB 140 may be facilitated.

In FIG. 2A, in the display apparatus 200 according to the Comparison Example, the flexible PCB 240 and a circuit board 260 are adhered onto the organic light emitting display 210, such that an area of a battery 230 occupying the organic light emitting display 210 is limited to an area excluding an area of the flexible PCB 240 and an area of the circuit board 260 on the organic light emitting display 210.

However, as shown in FIG. 1A, the battery 130 is disposed on a surface of the organic light emitting display 110, and then the flexible PCB 140 is adhered onto the battery 130, such that the battery 130 may be disposed to cover at least the display region N of the organic light emitting display 110. The battery 130 may be disposed to cover the organic light emitting display 110. Therefore, the size of the battery 130 may be increased equal to the size of the organic light emitting display 110, such that the capacity of the battery 130 may be increased and the battery 130 may stably support the organic light emitting display 110.

Figure 4:
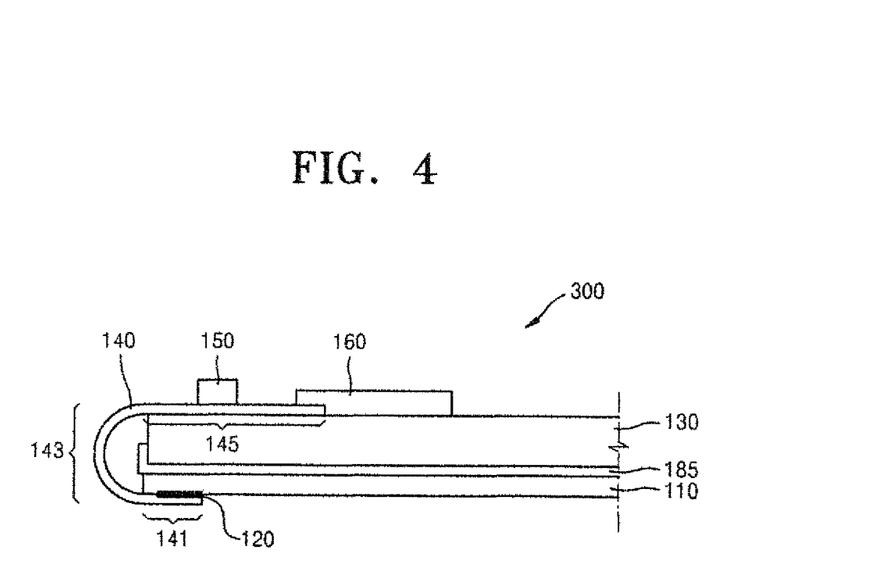
FIG. 4 is a cross-sectional view schematically showing a display apparatus according to another embodiment of the present invention.

FIG. 4 is a cross-sectional view schematically showing a display apparatus 300 according to another embodiment of the present invention.

Hereinafter, a description will be focused on differences of the display apparatus 300 as compared to the display apparatus 100 according to FIGS. 1A and 1B.

Referring to FIG. 4, the display apparatus 300 further includes a bracket 185. The bracket 185 receives the battery 130. For stability, the bracket 185 may be disposed between the battery 130 and the organic light emitting display 110.

Figure 5:
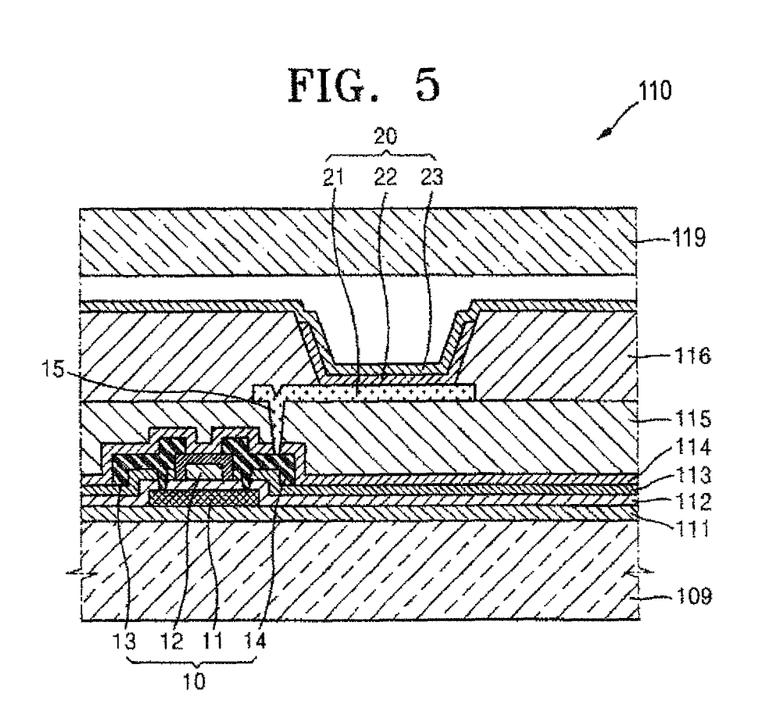
FIG. 5 is a cross-sectional view showing an example of an organic light emitting display shown in FIG. 1A.

FIG. 5 is a cross-sectional view showing an example of the organic light emitting display 110 shown in FIG. 1A.

Referring to FIG. 5, the organic light emitting display 110 in which the display unit includes an organic light emitting device 20 according to the current embodiment may include the first substrate 109, the organic light emitting device 20, and a second substrate 119.

On the first substrate 109 may be provided the organic light emitting device 20 and a thin film transistor (TFT) 10 connected to the organic light emitting device 20. Although one organic light emitting device 20 and one TFT 10 are shown in FIG. 5, such illustration is merely for convenience of explanation, and the organic light emitting display 110 according to the current embodiment may also include a plurality of organic light emitting devices 20 and a plurality of TFTs 10.

According to whether driving of each organic light emitting device 20 is controlled by the TFT 10, there may be two types: a passive matrix (PM) type and an active matrix (AM) type. The organic light emitting display 110 according to the current embodiment may be applied to any one of the two types. Hereinafter, an embodiment of the present invention will be described in detail with an example of an AM-type organic light emitting display.

On the first substrate 109 may be further provided a buffer layer 111 formed of $SiO_2$ and/or SiNx to achieve flatness of the first substrate 109 and prevent permeation of impurity elements.

An active layer 11 of the TFT 10 is formed of a semiconductor material on the buffer layer 111, and a gate insulation layer 112 is formed to cover the active layer 11. On the gate insulation layer 112 is provided a gate electrode 12, and to cover the gate electrode 12, an interlayer insulation layer 113 is formed. On the interlayer insulation layer 113 are provided a source electrode 13 and a drain electrode 14, and to cover them, a passivation layer 114 and a planarization layer 115 are sequentially provided.

The gate insulation layer 112, the interlayer insulation layer 113, the passivation layer 114, and the planarization layer 115 may be provided as insulators, and may be formed of an inorganic material, an organic material, or an organic/inorganic compound in a single-layer or multi-layer structure. The aforementioned stack structure of the TFT 10 is merely an example, and other various structures may be used for TFT 10.

A first electrode 21 serving as an anode electrode of the organic light emitting device 20 is formed on the planarization layer 115, and contacts the drain electrode 14 via a contact hole 15 in the planarization layer 115. A pixel define layer 116, formed of an insulation material, covers the first electrode 21 and the planarization layer 115. After a predetermined opening is formed in the pixel define layer 116, an organic light emitting layer 22 of the organic light emitting device 20 is formed within a region defined by the opening in contact with the first electrode 21. To cover all pixels, a second electrode 23 serving as a cathode electrode of the organic light emitting device 20 is formed. Polarities of the first electrode 21 and the second electrode 23 may be exchanged.

The organic light emitting display 110 according to the current embodiment is of a bottom-emission type in which an image is formed toward the first substrate 109. Thus, the first electrode 21 may be provided as a transparent electrode, and the second electrode 23 may be provided as a reflective electrode.

The first electrode 21 may be formed of Indium Tin Oxide (ITO), Indium Zinc Oxide (IZO), Zinc Oxide (ZnO), $In_2O_3$, or the like, and the second electrode 23 may be formed of Li, Ca, LiF/Ca, LiF/Al, Al, Mg, and a compound thereof.

The organic light emitting layer 22 provided between the first electrode 21 and the second electrode 23 may be provided as a low-molecular weight organic material or a high-molecular weight organic material. When the low-molecular weight organic material is used, a hole injection layer (HIL, not shown), a hole transport layer (HTL, not shown), an electron transport layer (ETL, not shown), an electron injection layer (EIL, not shown), etc., may be stacked with the organic light emitting layer 22 interposed therebetween in a single or complex structure, and various organic materials are available, such as copper phthalocyanine (CuPc), N, N'-di (naphthalene-1-yl)-N,N'-diphenyl-benzidine (NPB), tris-8-hydroxyquinoline aluminum (Alq3), and so forth. Such low-molecular weight organic materials may be formed by vacuum deposition using masks.

When the high-molecular weight organic material is used, an HTL (not shown) may be further provided from the organic light emitting layer 22 toward the anode electrode. In this case, PEDOT (Poly(3,4-ethylenedioxythiophene)) or PEDOT:PSS (a solution of Poly(3,4-ethylenedioxythiophene) poly(styrenesulfonate)) is used for the HTL, and high-molecular weight organic materials such as poly-phenylenevinylene (PPV)-based or polyfluorene-based materials may be used for the organic light emitting layer 22.

On the first substrate 109 including the organic light emitting device 20, the second substrate 119 for encapsulating the organic light emitting device 20 is disposed to face the first substrate 109.

Figure 6:
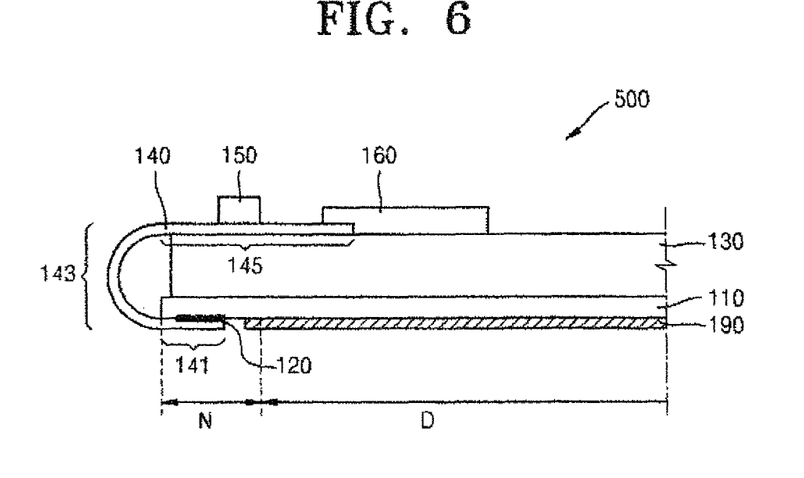
FIG. 6 is a cross-sectional view schematically showing a display apparatus according to further another embodiment of the present invention.

FIG. 6 is a cross-sectional view schematically showing a display apparatus 500 according to further another embodiment of the present invention.

The following description will be focused on differences of the display apparatus 300 compared to the display apparatus 100 according to FIG. 1A.

Referring to FIG. 6, a polarization film 190 may be provided on a surface of the organic light emitting display 110. In particular, a flat panel display apparatus including an organic light emitting device includes the polarization film 190 on a substrate on which an image is formed, to solve a bright room contrast problem. In this case, the battery 130 may be disposed on a surface of the organic light emitting display 110 opposite the polarization film 190.

Figure 7:
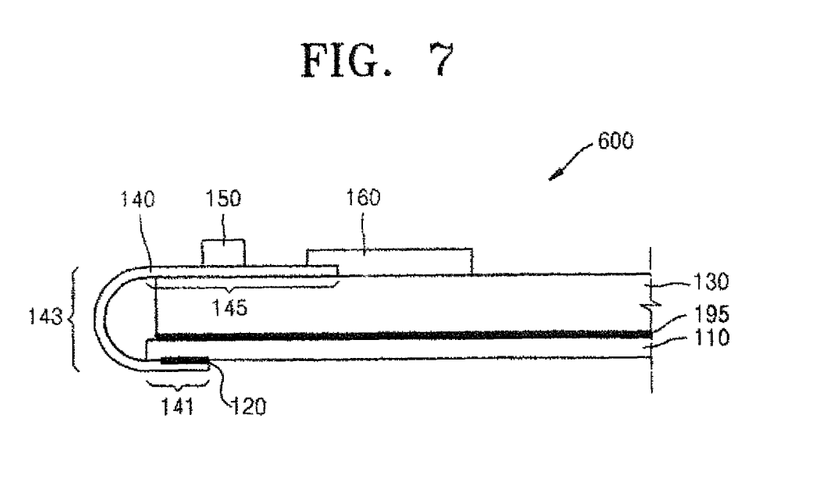
FIG. 7 is a cross-sectional view schematically showing a display apparatus according to yet another embodiment of the present invention.

FIG. 7 is a cross-sectional view schematically showing a display apparatus 600 according to yet another embodiment of the present invention.

The following description will be focused on differences of the display apparatus 300 compared to the display apparatus 100 according to FIG. 1A.

Referring to FIG. 7, a light blocking portion 195 is provided on a surface of the battery 130 adhered with the organic light emitting display 110.

Referring again to FIG. 2A, in case of the display apparatus 200 according to the Comparison Example, a black tape 280 is adhered onto the organic light emitting display 210. As a result, manufacturing of the organic light emitting display 210 needs a process of adhering the black tape 280 onto the organic light emitting display 210.

Therefore, by including the light blocking portion 195 on the surface of the battery 130 adhered with the organic light emitting display 110 as shown in FIG. 7, the process of adhering the black tape 280 onto the organic light emitting display 210 may be omitted.

The display apparatus according to the present invention achieved as described above can have the following effects:
first, as the radius of curvature of the bent portion of the flexible PCB is increased, a damage of the bent portion of the flexible PCB (film lead crack) can be prevented;
second, as the driver-integrated circuit (DR-IC) is disposed outside the flexible PCB, a crack in the chip due to a physical shock caused in adhesion of the flexible PCB (IC crack) may be prevented;
third, the adhered flexible PCB is prevented from coming off due to a tension of the flexible PCB;
fourth, as an adhered surface of the flexible PCB is expanded, adherence of the flexible PCB can be made easy;
fifth, the size of the battery can be increased equal to the size of the organic light emitting display, thus increasing the capacity of the battery and stably supporting the organic light emitting display; and
sixth, by providing the light blocking portion on a surface of the battery adhered with the organic light emitting display, a conventional process of adhering the black tape to the organic light emitting display can be omitted.

While the present invention has been described with reference to exemplary embodiments shown in the drawings, the disclosed embodiments are merely illustrative and it will be understood by those of ordinary skill in the art that various changes and other equivalent embodiments may be made from the embodiments. Therefore, the true technical scope of the present invention should be defined by the technical spirit of the appended claims.

What is claimed is:

1. A display apparatus comprising:
an organic light emitting display comprising a terminal portion;
a battery disposed on a surface of the organic light emitting display physically contacting with the surface; and
a flexible printed circuit board bent to cover a portion of the organic light emitting display and the battery, a side of the flexible printed circuit board being connected to the terminal portion and another side of the flexible printed circuit board attached to and extending outside the battery.

2. The display apparatus of claim 1, wherein the battery is disposed to cover at least a display region of the organic light emitting display.

3. The display apparatus of claim 1, wherein the battery is disposed to cover the organic light emitting display.

4. The display apparatus of claim 1, wherein the organic light emitting display comprises an organic light emitting device.

5. The display apparatus of claim 1, further comprising a light blocking portion on a surface of the battery adhered with the organic light emitting display.

6. The display apparatus of claim 1, further comprising a bracket for receiving the battery.

7. The display apparatus of claim 6, wherein the bracket is disposed between the battery and the organic light emitting display.

8. The display apparatus of claim 1, further comprising a polarization film.

9. The display apparatus of claim 8, wherein the polarization film is disposed on a side of the organic light emitting display on which an image is formed.

10. The display apparatus of claim 9, wherein the battery is disposed on a surface of the organic light emitting display opposite the polarization film.

11. The display apparatus of claim 1, wherein the flexible printed circuit board is a chip on film.

12. The display apparatus of claim 11, wherein the chip on film comprises:
   a terminal connection portion connected to the terminal portion;
   a bent portion bent between the terminal portion and the battery; and
   an extension portion extending toward and attached to the battery.

13. The display apparatus of claim 12, wherein a distance between the extension portion and the terminal connection portion is greater than a sum of a thickness of the battery and a thickness of the organic light emitting display.

14. The display apparatus of claim 12, wherein the chip on film comprises a driver-integrated circuit for driving the display apparatus.

15. The display apparatus of claim 14, wherein the driver-integrated circuit is disposed on a side of the extension portion.

16. The display apparatus of claim 15, wherein the driver-integrated circuit is disposed toward outside the battery.

17. The display apparatus of claim 12, further comprising a circuit board electrically connected with the chip on film to supply a data signal to the terminal portion.

18. The display apparatus of claim 17, wherein the circuit board is electrically connected with the extension portion of the chip on film.

19. The display apparatus of claim 18, wherein the circuit board is disposed outside the battery.

* * * * *